(12) United States Patent
Morioka

(10) Patent No.: US 6,512,572 B1
(45) Date of Patent: Jan. 28, 2003

(54) EXPOSURE APPARATUS, METHOD, AND STORAGE MEDIUM

(75) Inventor: Toshinobu Morioka, Fujisawa (JP)

(73) Assignee: Nikon Corporation, Tokyo (JP)

( * ) Notice: Subject to any disclaimer, the term of this patent is extended or adjusted under 35 U.S.C. 154(b) by 89 days.

(21) Appl. No.: 09/613,768

(22) Filed: Jul. 11, 2000

Related U.S. Application Data

(63) Continuation of application No. PCT/JP99/00479, filed on Feb. 4, 1999.

(30) Foreign Application Priority Data

Feb. 6, 1998 (JP) .............................. 10-025260

(51) Int. Cl.⁷ ..................... G03B 27/42; G03B 27/68
(52) U.S. Cl. ..................... 355/53; 355/52; 356/401
(58) Field of Search ................. 355/52, 53, 65, 355/67; 430/5, 20, 30; 356/399–401; 250/548

(56) References Cited

U.S. PATENT DOCUMENTS

| | | | |
|---|---|---|---|
| 5,525,808 A | * | 6/1996 | Irie et al. ................. 250/548 |
| 5,859,690 A | * | 1/1999 | Toguchi ..................... 355/53 |
| 5,898,477 A | * | 4/1999 | Yoshimura et al. ........... 355/53 |
| 5,973,766 A | * | 10/1999 | Matsuura et al. ............ 355/52 |

\* cited by examiner

*Primary Examiner*—Henry Hung Nguyen
(74) *Attorney, Agent, or Firm*—Oliff & Berridge, PLC

(57) ABSTRACT

A display unit (22) displays a shot map, and an operator designates an evaluation point on the shot map. A exposure control unit (21) computes the position coordinates on a projection area (on a plate) corresponding to the designated evaluation point, and outputs the result to the display unit (22). When an overlapping portion is detected in a pattern exposed onto the substrate (6), and an evaluation point is designated on the overlapping portion, the exposure control unit (21) outputs corresponding pattern candidates, and the operator can select a desired pattern from among the candidates. Furthermore, when one point is designated on a shot map, two points containing a pattern boundary are automatically indicated as evaluation points. Thus, an evaluation point can be designated, and the position on the plate can be correctly obtained within a short time, thereby improving the operation efficiency of the apparatus.

14 Claims, 15 Drawing Sheets

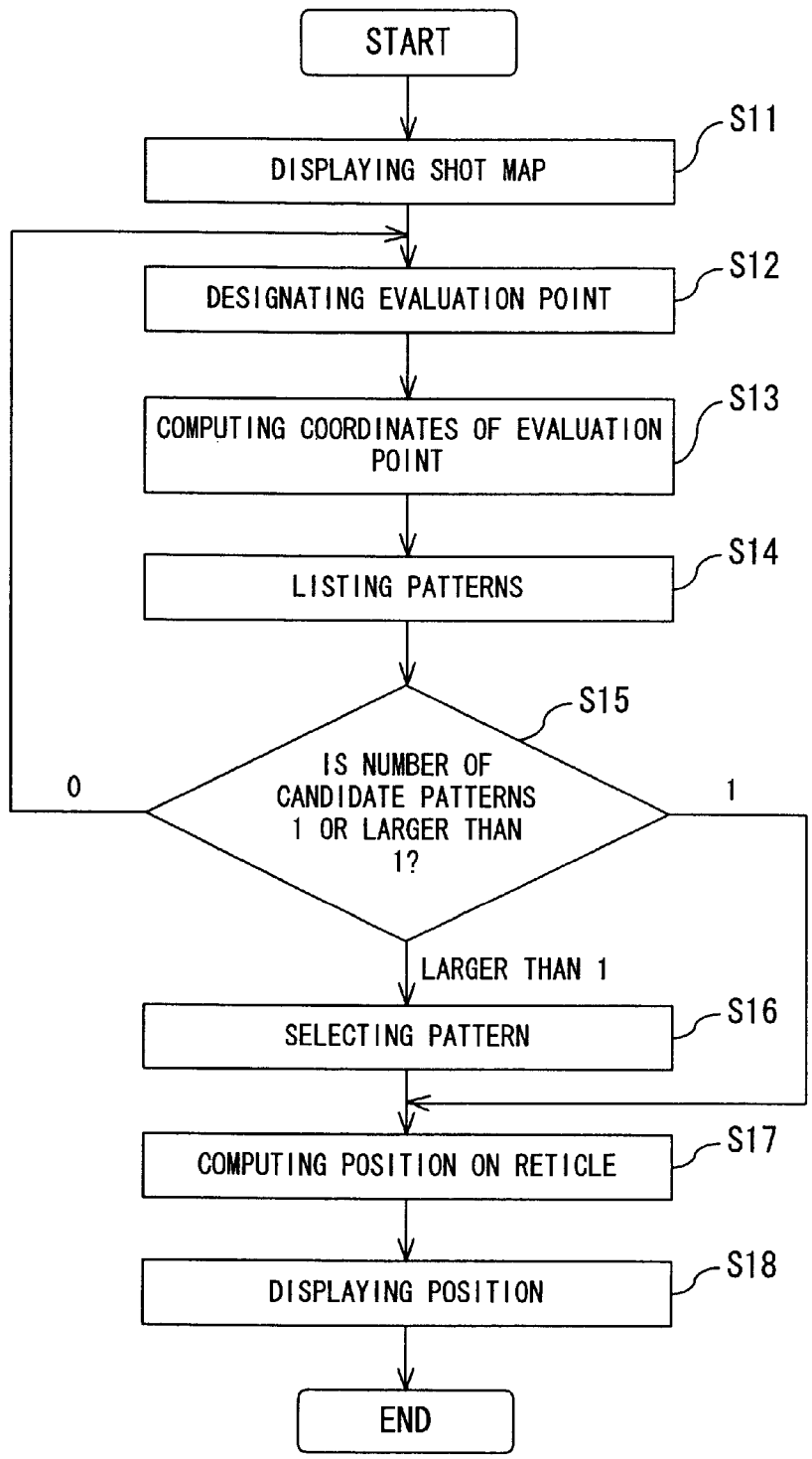
F I G. 1 1

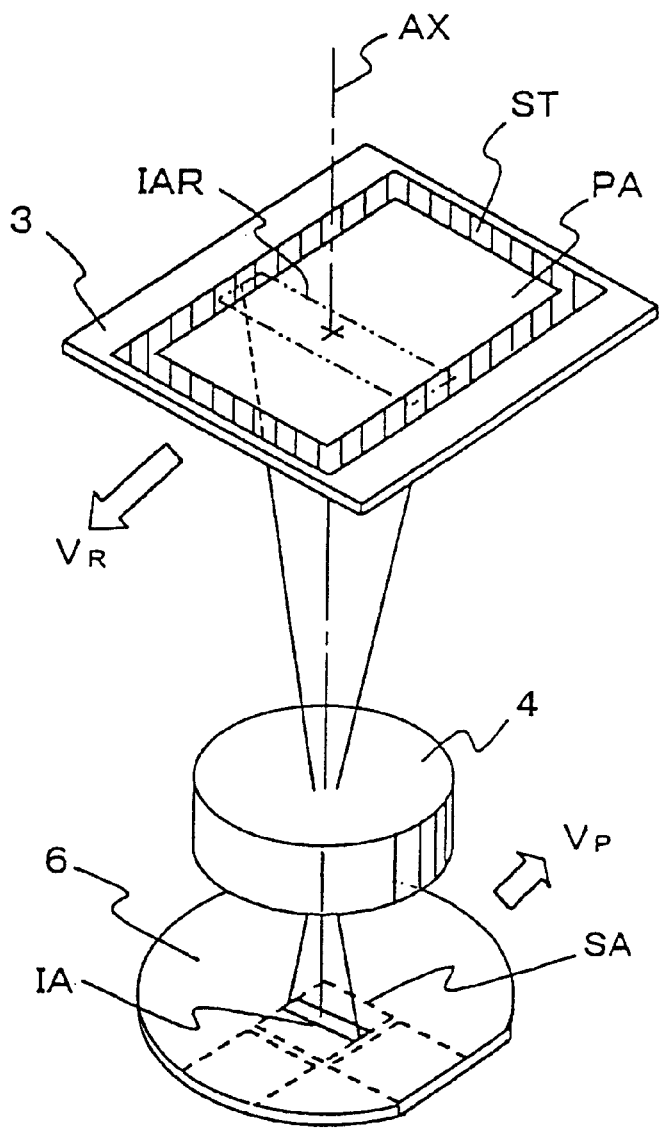
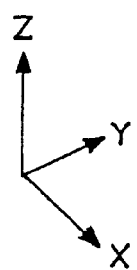
FIG. 14

EXPOSURE APPARATUS, METHOD, AND STORAGE MEDIUM

CROSS REFERENCE TO RELATED APPLICATION

This application is a continuation of International PCT Application No. PCT/JP99/00479 filed on Feb. 4, 1999.

BACKGROUND OF THE INVENTION

1. Field of the Invention

The present invention relates to a projective exposure apparatus for exposing a desired pattern onto a liquid crystal or semiconductor substrate, etc.

2. Description of the Related Art

FIG. 1 shows the configuration of a conventional projective exposure apparatus 1 used in producing a liquid crystal display (LCD). The projective exposure apparatus 1 is a projective exposure apparatus in a step-and-repeat system. With the configuration, an LCD pattern formed on a reticle or a mask (hereinafter referred to as a reticle) 3 is irradiated by an illuminating optical system 2, and is exposed onto a predetermined exposure area of a plate 6 which is a rectangular glass substrate placed on an XY stage 5 by a projective optical system 4. When a pattern is transferred by the exposure, the plate 6 is moved by a predetermined distance by moving the XY stage 5, and the LCD pattern is exposed onto another exposure area. Thus, the process of exposing the LCD pattern is repeated for predetermined times. Then, the reticle 3 is replaced with another reticle by a reticle exchange mechanism 10, the LCD pattern on the replacing reticle is sequentially exposed on a predetermined exposure area for predetermined times, and a plurality of reticle patterns are transferred to the entire plate 6.

In the above described exposure apparatus in the step-and-repeat system, the position of the plate 6 on the XY stage 5 is correctly monitored by a laser interferometer 7, and the coordinates of the position are designated. The alignment of the reticle 3 is performed by a reticle alignment system 8, and the alignment of the plate 6 is performed by a plate alignment system 9.

FIG. 2 shows an example of an LCD pattern transferred to the plate 6 by the projective exposure apparatus 1. As shown in FIG. 2, in transferring an LCD pattern, the pattern is divided into, for example, six patterns of A, B, C, D, E, and F. At each joint portion between patterns, a small amount of overlap exposure is carried out, and the patterns are exposed onto 6 positions (6 sections for 6 patterns). These 6 patterns are formed on 6 respective reticles. The six patterns are generated by repeating the exposure with the reticles replaced, thereby forming the entire LCD pattern as shown in the attached drawings.

In exposing a pattern in the above described screen generating method, there can be a discrepancy occurring at a joint portion between patterns as shown in FIGS. 3A, 3B, and 3C due to an alignment error of the reticle 3 and the plate 6, the distortion of the projective optical system 4, etc. That is, if a pattern to be transferred indicates a rotation error, or if there is an error due to the discrepancy of patterns at the positions of the patterns A and B to be transferred when a pattern is generated, then there can be the discrepancy at the joint of the exposed patterns as shown in FIGS. 3A and 3B. In addition, as shown in FIG. 3C, when patterns A' and B' (in solid lines) respectively overlap as the second layer the patterns A and B (in dotted lines) formed by the exposure of the first layer, there can be a discrepancy at the overlap between the first and the second layers. Furthermore, there can be a discrepancy at a joint portion or an overlap error occurring by the distortion of a projection lens. There also can be a discrepancy by a patterning error occurring when a patterning process is performed by exposing a pattern onto a reticle.

When an error occurs by the above described various factors, there arises the problem that an LCD substrate generated by the exposing process cannot have expected characteristics. To solve the problem, there has been a method developed to optimize the amount of amendment (amendment value) to cancel various errors when a pattern is exposed. In this method, the amount of discrepancy between patterns is measured from the transferred image obtained by trial exposure of a pattern, an amendment value is computed from the measured amount, and an amendment is made using the amendment value such that the discrepancy can be removed when the pattern is actually exposed.

To make the above described amendment, it is necessary to set the evaluation position (evaluation point) to evaluate the amount of discrepancy at the joint and the overlap of patterns, and to know the coordinates of the evaluation position on the reticle or the pattern projection area (plate). Furthermore, in a case where the erorr in the joint potion in to be amended, as shown in FIG. 3B, it is necessary to amend the position of the reticle of the pattern B upward when the pattern A is a reference pattern while it is necessary to amend the position of the reticle of the pattern A downward when the pattern B is a reference pattern. Thus, the error amending process has been very complicated. However, the conventional apparatus does not have the function of computing the coordinates of an evaluation position, but an operator manually reads the coordinates of a number of evaluation positions on a plate. The manual settings of coordinates are a laborious operation requiring a very long time. Especially when a plate is large, the evaluation point should reach approximately 100, and the operation is a large load in generating a substrate.

The above described problem can be caused in a projective exposure apparatus in the step-and-repeat system for a semiconductor element, image pickup device (CCD, etc.), and thin film magnetic head, etc. as well as a projective exposure apparatus in the step-and-repeat system for an LCD.

In addition, such a problem can also be caused in another type of projective exposure apparatus. Actually, a projective exposure apparatus can be a projective exposure apparatus in a scanning system, an electron beam (EB) projective exposure apparatus, etc. in addition to the projective exposure apparatuses in the step-and-repeat system.

The present invention has been developed to solve the above described problems, and aims at correctly designating an evaluation point and setting the coordinates on the reticle or the plate within a short time, and improving the efficiency of the pattern exposing operation.

SUMMARY OF THE INVENTION

To solve the above described problems, an embodiment of the present invention is described below by referring to FIGS. 4 through 6, 11 and 13. According to various embodiments, the exposure apparatus exposes a pattern on a reticle (3) onto the exposure area of a substrate (6), and includes a display unit (22) for displaying a shot map showing the exposure area, a designation unit (23) for designating an evaluation position on the shot map, and an output unit (21, 22) for outputting the information about the position of the reticle (3).

The exposure apparatus according to other various embodiments includes a reticle exchange unit (10) for holding a plurality of reticles (3), and an exposure control unit (21) for exposing a part of the patterns on the plurality of reticles (3) as overlapping onto the substrate (6).

In the exposure apparatus according to other various embodiments, the output unit (21, 22) outputs plural pieces of information about the position of the reticle (3) when the designated position refers to the overlapping portion.

The exposure apparatus according to other various embodiments includes a selection unit (23) for selecting the information about the position of a reticle from among the plurality of reticles corresponding to the overlapping portion when the designated position refers to the overlapping portion.

In the exposure apparatus according to other various embodiments, the information about the position of the reticle (3) refers to at least one of the position from the center of the reticle (3) and the position from the center of the pattern.

The exposure apparatus according to other various embodiments exposes a pattern on the reticle (3) onto a plurality of exposure areas of the substrate (6), and includes the display unit (22) for displaying a shot map showing the plurality of exposure areas, a designation unit (23) for designating an evaluation position on the shot map, a storage unit (25) for storing the information about an error of the exposure as corresponding to the plurality of exposure areas, and the output unit (21, 22) for outputting the information about the error of the exposure at the designated position.

The exposure apparatus according to other various embodiments is operated in the step-and-repeat system or the scanning system.

In the exposing method according to other various embodiments, a pattern on the reticle (3) is exposed onto the exposure area of the substrate (6). The method includes a step (S1, S11, S21) of displaying a shot map showing the exposure area, a step (S2, S12, S22) of designating an evaluation position on the shot map, and a step (S6, S18, S29) of outputting the information about the position of the reticle corresponding to the designated position.

The exposing method according to other various embodiments includes a step of exposing a part of the patterns on the plurality of reticles (3) as overlapping onto the substrate (6).

The exposing method according to other various embodiments includes a step of outputting plural pieces of information about the position of the reticle (3) when the designated position refers to the overlapping portion.

The exposing method according to other various embodiments includes a step (S16, S26) of selecting the information about the position of a reticle from among the plurality of reticles corresponding to the overlapping portion when the designated position refers to the overlapping portion.

In the exposing method according to other various embodiments, the information about the position of the reticle (3) refers to at least one of the position from the center of the reticle (3) and the position from the center of the pattern.

The exposing method according to other various embodiments exposes a pattern on the reticle (3) onto a plurality of exposure areas of the substrate (6), and includes a step (S1, S11, S21) of displaying a shot map showing the plurality of exposure areas, a step (S2, S12, S22) of designating an evaluation position on the shot map, a step of storing the information about an error of the exposure as corresponding to the plurality of exposure areas, and a step of outputting the information about the error of the exposure at the designated position.

The storage medium according to the present invention is a computer-readable storage medium storing a computer program for realizing the exposing method for exposing the pattern on a reticle onto the exposure area of the substrate. The computer program executes each of the above described steps of the methods according to various embodiments. By executing the program using a computer, the above described operations can be quickly performed. The storage medium is realized as an internal storage medium such as ROM, RAM, a hard disk, etc., and an external storage medium such as CDROM, a floppy disk, an MD, etc.

BRIEF DESCRIPTION OF THE DRAWINGS

FIG. 11 is a flowchart showing the second example of the evaluation point determining process according to present invention;

FIG. 14 shows a projective optical system of a projective exposure apparatus in an inversion/reduction scanning system.

DESCRIPTION OF THE PREFERRED EMBODIMENTS

The embodiments of the present invention are described below by referring to the attached drawings.

Figure 1:
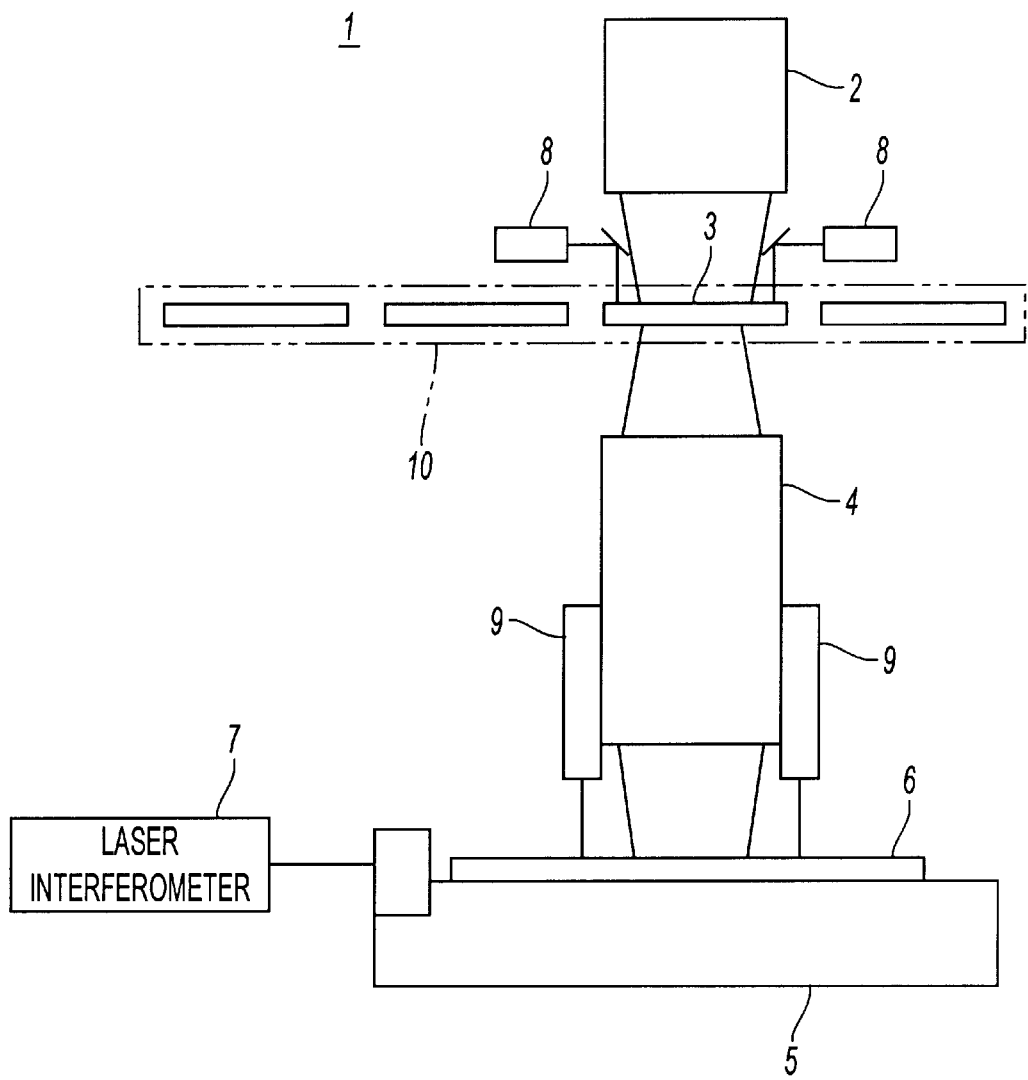
FIG. 1 shows the configuration of the conventional exposure apparatus.
Figure 2:
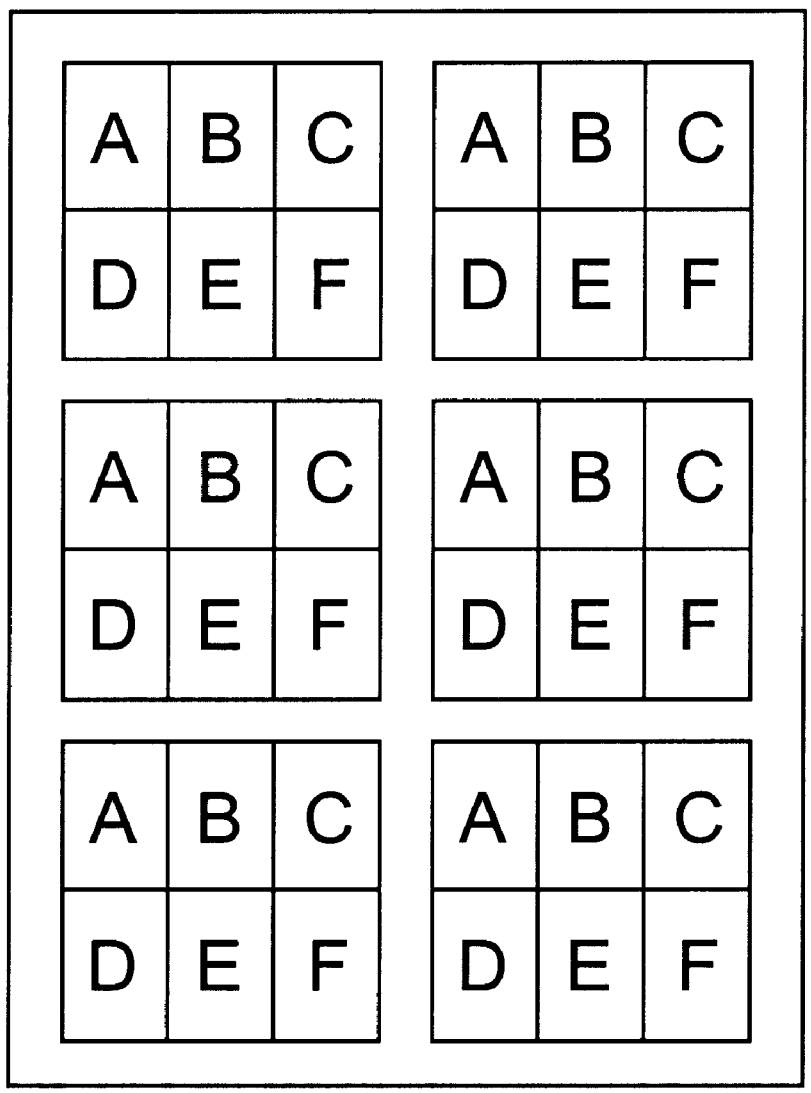
FIG. 2 shows an example of the arrangement of a pattern on a plate.
Figure 3A:
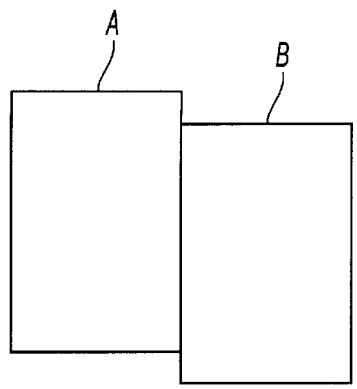
FIGS. 3A, 3B, and 3C show the joint of patterns.
Figure 3B:
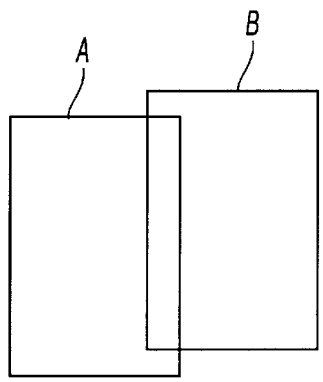
Figure 3C:
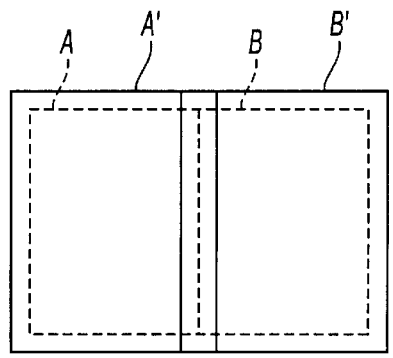
Figure 4:
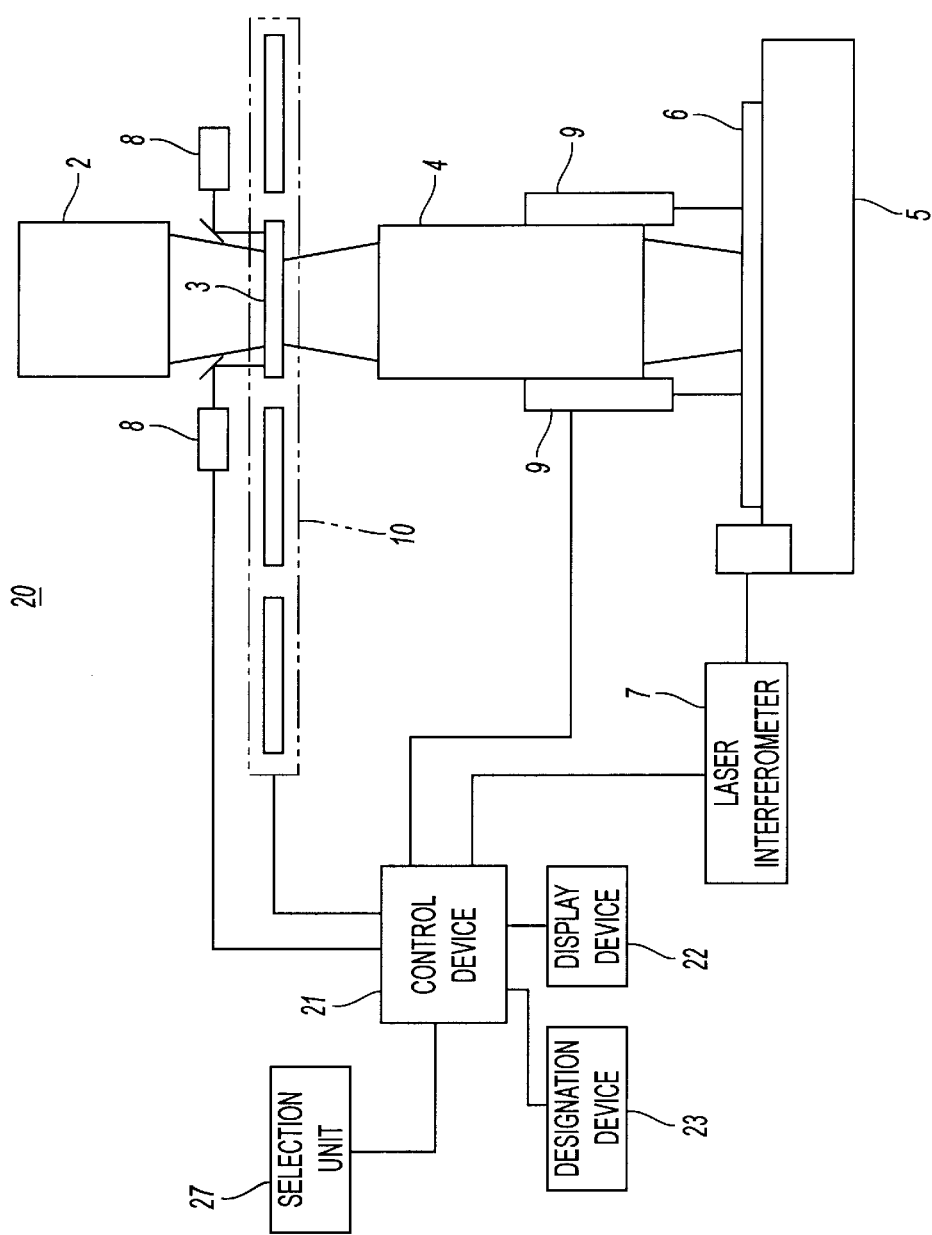
FIG. 4 shows the configuration of an embodiment of the exposure apparatus according to the present invention.

FIG. 4 shows the configuration of the exposure apparatus according to the present invention. In FIG. 4, the elements also shown in FIG. 1 are assigned the same reference numbers, and the detailed explanation of the elements are omitted here.

Figure 5:
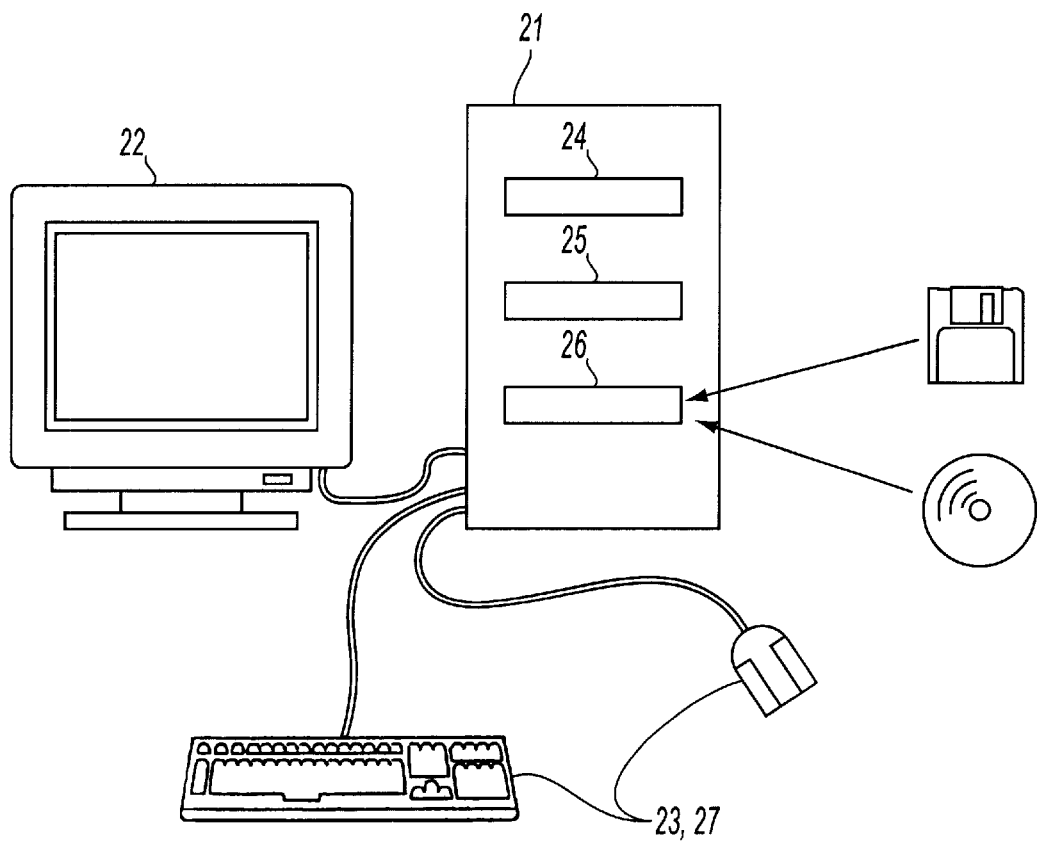
FIG. 5 shows the configuration of the control unit, the display unit, and the designation unit of the exposure apparatus according to the present invention.

An exposure apparatus 20 according to the present embodiment is, for example, a projective exposure apparatus for a liquid crystal display (LCD stepper). The exposure apparatus 20 comprises, in addition to the configuration of the conventional projective apparatus 1 shown in FIG. 1, a control device 21, a display device 22, and a designation device 23. FIG. 5 shows a practical configuration of the control device 21, the display device 22, and the designation device 23. As shown in FIG. 5, the control device 21 comprises a data processing unit 24 using a CPU, etc., memory 25 for storing various data, and a driver 26 for a storage medium. The data processing unit 24 performs the processes described below, and the memory 25 holds a program for performing the processes, and data required to perform the processes. In addition, the driver 26 is used to install a program and data stored in an external storage medium in the data processing unit 24 and the memory 25, and the designation device 23 is used by an operator inputting data required to perform a process.

The control device 21 controls the reticle exchange mechanism 10 exchanging reticles, the reticle alignment system 8 aligning a reticle, the laser interferometer 7 positioning a plate, and the plate alignment system 9 aligning a plate, thereby controlling the entire exposure of a generated screen by exposing a desired LCD pattern after overlapping a plurality of reticles a little bit. The generation of a screen is described in the patent application Ser. No. 08/391588 filed with the U.S. Patent Office by the Applicant of the present invention on Feb. 21, 1995. The description of the U.S. patent application Ser. No. 08/391588 is included as a part of the description of the specification of the present invention. The memory 25 of the control device 21 stores shot map data indicating the position of an exposure area on the plate 6 of each pattern. Additionally, the memory 25 stores the position of the reticle 3, the rotation, the magnification of the projection by the projective optical system 4, the error information about plate scaling, etc., and an amendment value. The error information and an amendment value can be normally obtained by exposing one or more plates before exposing a large number of plates by the exposure aparatus 20. Exposing the first one or more plates before starting mass exposure is referred to as trial exposure. The trial exposure is performed on a layer requiring high precision in generating an LCD. The amount of joint discrepancy between shots and the overlap discrepancy on a lower layer of each shot are measured to obtain the error information. If the discrepancy amount is within an allowable value in designing an LCD, it is acceptable. However, it is desirable to adjust the position of a shot such that a target value can be obtained to attain a larger yield for a layer requiring high precision. Accordingly, to adjust the position of a shot, an amendment value is computed from the error information stored for a measurement point. When liquid crystal substrates are put into mass production by the exposure apparatus 20, an amendment value is read from the memory 25 depending on the evaluation point on a designated pattern. The rotation error of the reticle 3 is amended by rotating the reticle 3 using a reticle stage not shown in the attached drawings. The reticle 3 and the magnification error of the projective optical system 4 can be amended by moving the lens forming part of the projective optical system 4 toward the optical axis of the projective optical system 4, and adjusting the pressure of a lens cabinet.

Described below is the process of determining an evaluation point by the exposure apparatus according to the present embodiment. Normally, an evaluation point is located on a joint side of each shot forming part of one LCD. It is common to have a plurality of evaluation points on a joint side. However, since the number of evaluation points increases when the number of shots forming part of an LCD is large, or when there are a plurality of LCDs on a plate, an evaluation time, especially a measurement time is taken. Therefore, in consideration of the necessary precision or production experience for a layer to be exposed, the evaluation time can be shortened by decreasing the number of LCDs on a plate to be evaluated, or by evaluating in detail only one LCD on the plate and decreasing the number of evaluation points of other LCD of the plate into the smallest possible number. Described below is the process performed when an evaluation point is determined on one target point.

Figure 6:
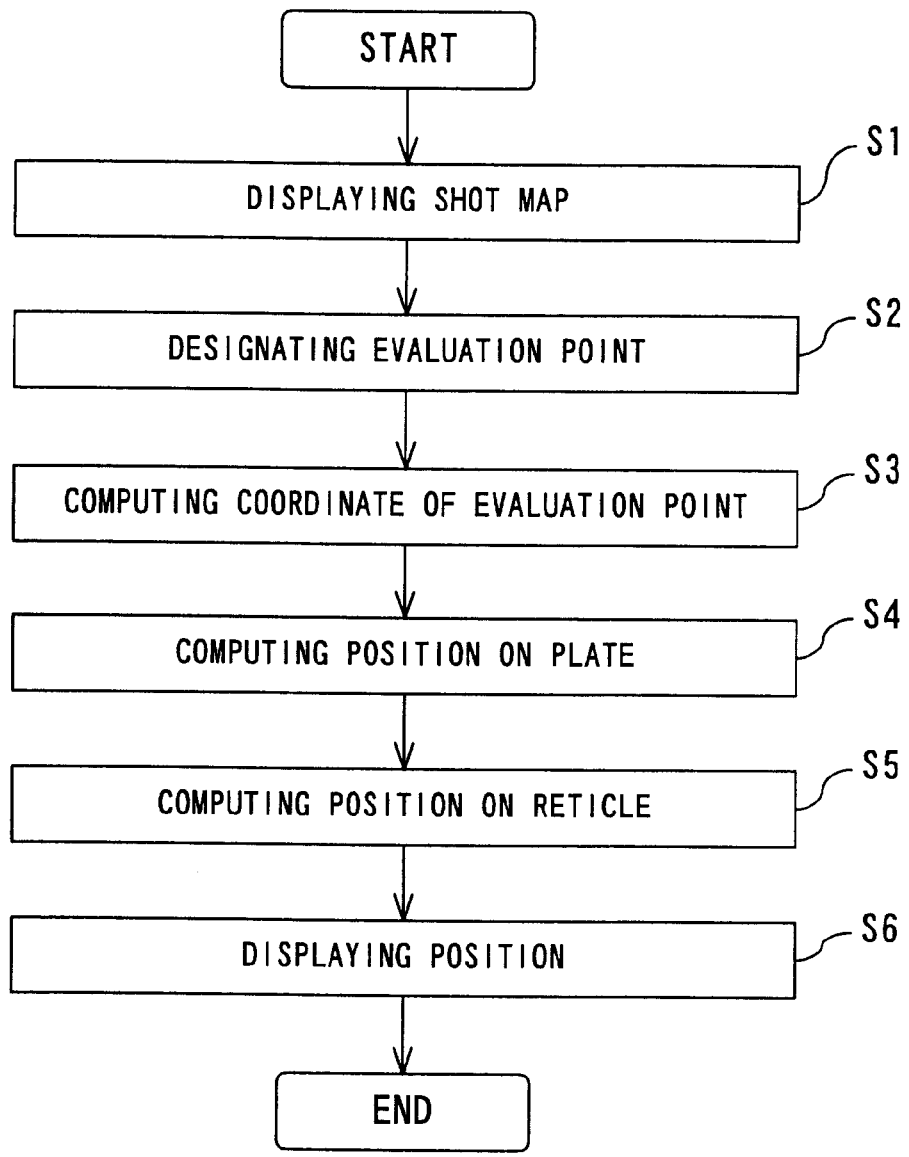
FIG. 6 is a flowchart of the basic process of determining the evaluation point according to the present invention.
Figure 7:
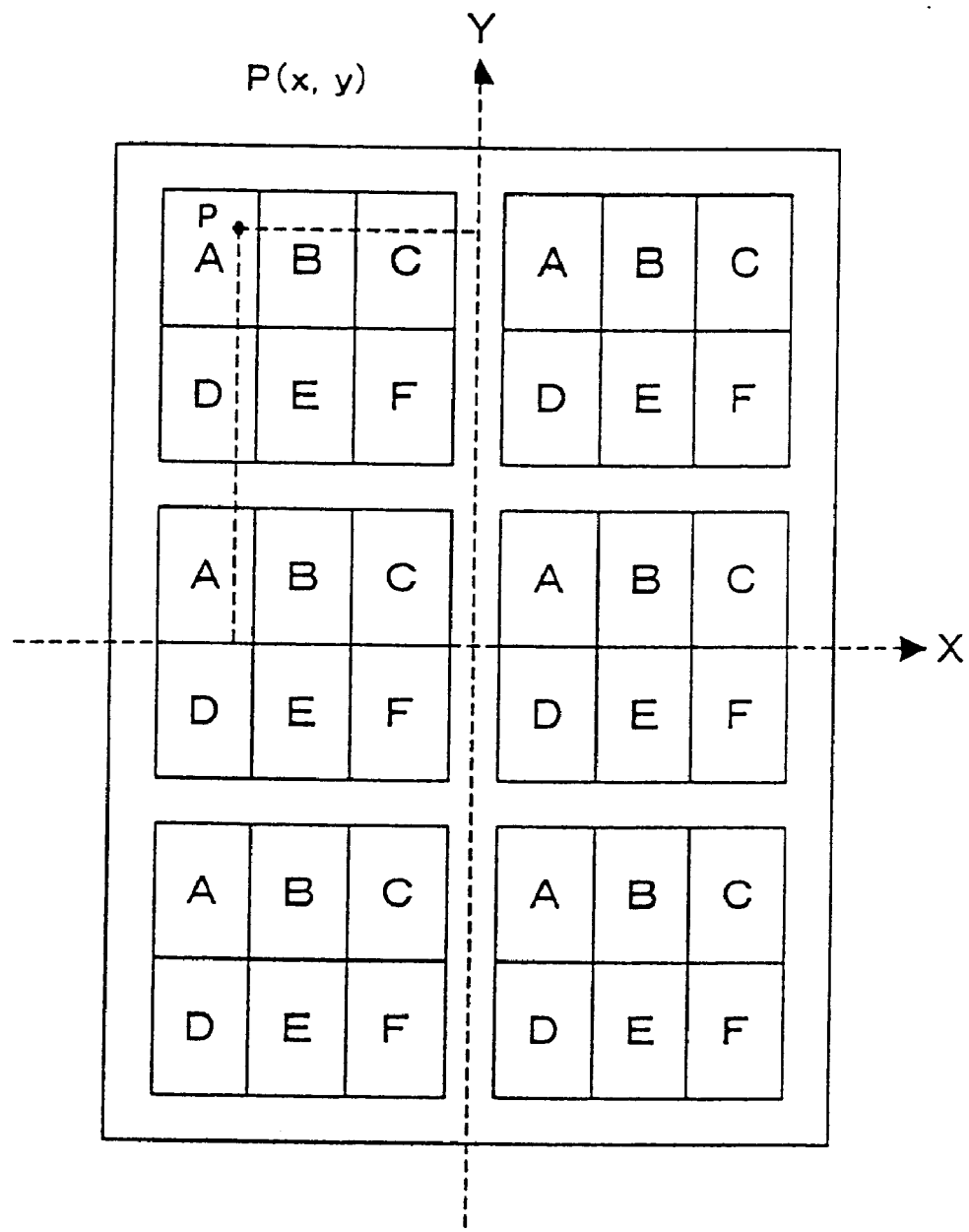
FIG. 7 shows an example of displaying a shop map, and the designation of an evaluation point.
Figure 8:
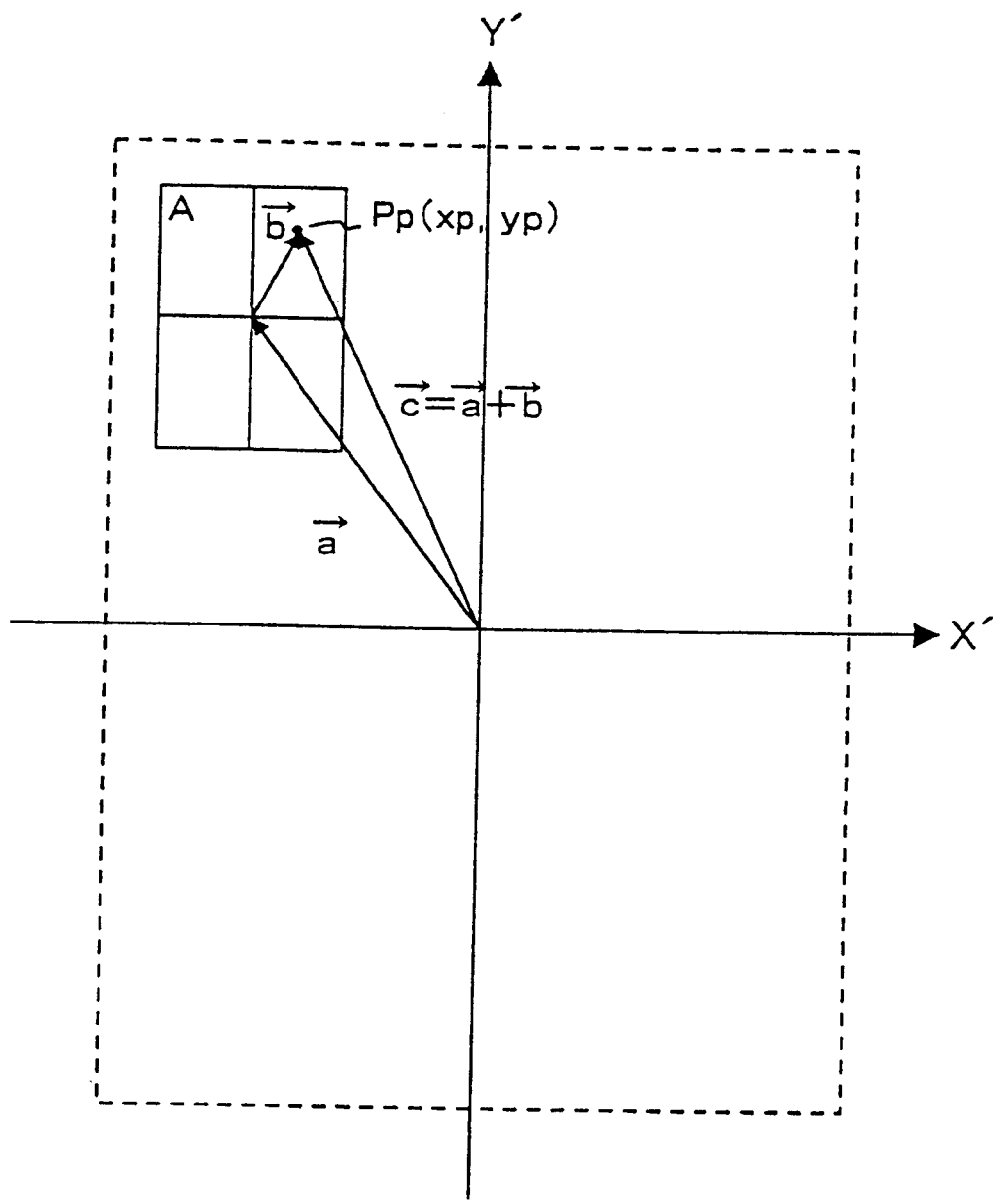
FIG. 8 shows the method of computing the coordinates of the evaluation point on a plate.

FIG. 6 is a flowchart of the basic process of determining an evaluation point by the exposure apparatus 20 according to the present embodiment. When the process is started, the display device 22 first displays a shot map (step S1), and an operator designates one point on the shot map as an evaluation point using the designation device 23 such as a mouse, etc. (step S2). FIG. 7 shows the shot map displayed on the display device 22, and an example of an evaluation point P designated on the map by the operator. When the evaluation point P is designated, the data processing unit 24 of the control device 21 computes the coordinates P (x, y) on the shot map of the evaluation point P (step S3).

When a pattern is selected, the data processing unit 24 computes the position of the point $P_P$ on the plate 6 corresponding to the evaluation point P (step S4). In computing the position of the point $P_P$ on the plate 6, the data processing unit 24 obtains the coordinates of the center of the pattern A relative to the center of the plate 6 on the plate 6, and the coordinates of the point $P_P$ on the plate 6 corresponding to the evaluation point P relative to the center of the pattern A. The coordinates of the $P_P$ on the plate 6 from the center of the place can be obtained by adding the above described coordinates in vector. The data processing unit 24 computes the coordinates of the $P_R$ corresponding to the coordinates of the $P_P$ on the plate 6 of the reticle having the pattern A (step S5). Through the above described processes, the position of the measurement point (point $P_R$) on the reticle corresponding to the evaluation point designated by the operator can be computed. The data processing unit 24 has the display device 22 display the computed position of the point $P_R$ on the reticle (step S6).

The designation of an evaluation point is not limited to one point, but two or more points can be designated. When two or more points are designated, they are collectively designated in step S2. Then, the positions of two or more evaluation points designated in step S6 are collectively displayed. Otherwise, a series of the above described evaluation point determining process can be repeated the times equal to the number of the evaluation points to be designated.

Figure 9:
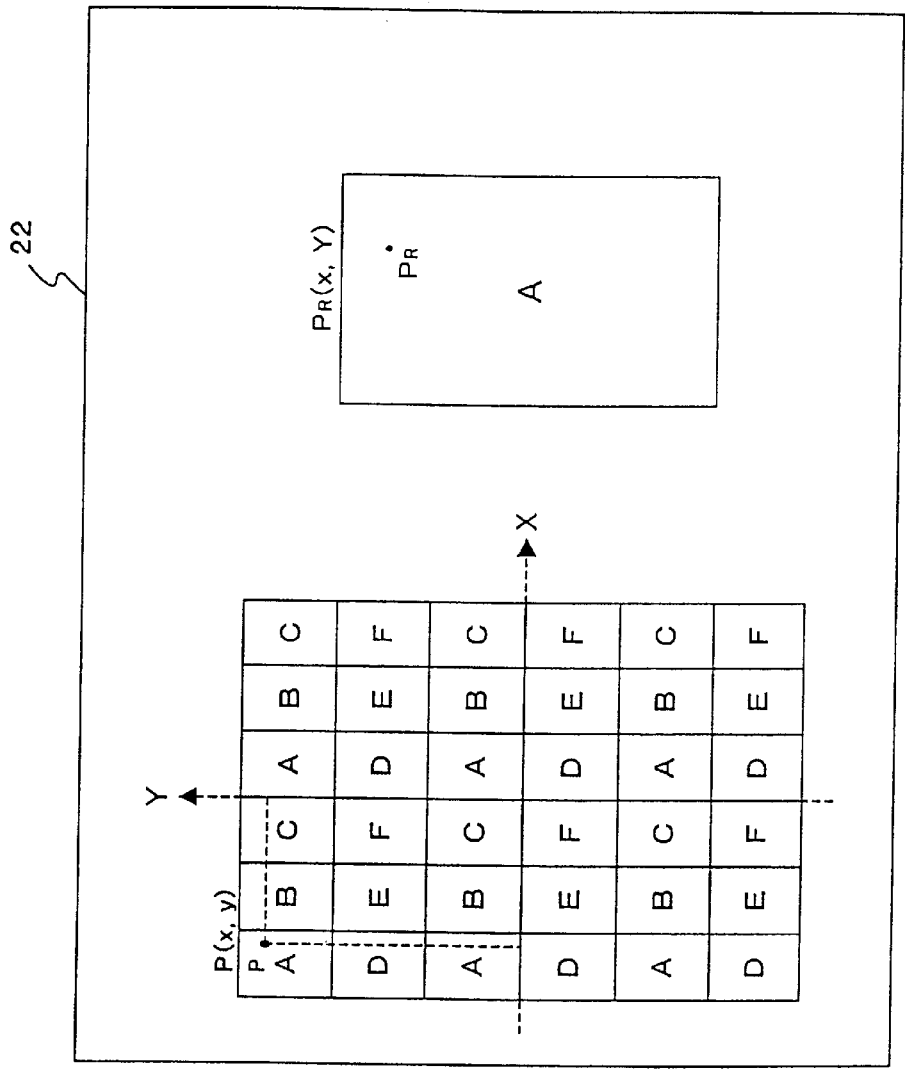
FIG. 9 shows an example of displaying an evaluation point determination result.

FIG. 9 shows an example of a display of the point $P_R$ on the reticle corresponding to the evaluation point P by the display device 22. As shown in FIG. 9, the display device 22 displays the shot map and the coordinates of the evaluation point P, and the coordinates of the point PR on the reticle 3 corresponding to the evaluation point P as a determination result of the evaluation point. The display is only one example of a display method, and it is obvious that only the coordinates can be displayed for the point $P_R$. After the above described process, the data processing unit 24 can read an amendment value corresponding the point PR on the reticle 3 from the memory 25, and can output the read amendment value to the display device 22.

Thus, the exposure apparatus according to the present embodiment can automatically obtain the corresponding coordinate data of the point $P_R$ on the reticle 3 only by the operator designating the evaluation point P on the displayed shot map. Therefore, an amendment value corresponding the obtained coordinates can be quickly detected, and correct pattern exposure to a substrate can be completed within a short time.

Described below is the second process of determining an evaluation point by the exposure apparatus 20 according to the present embodiment.

Figure 10A:
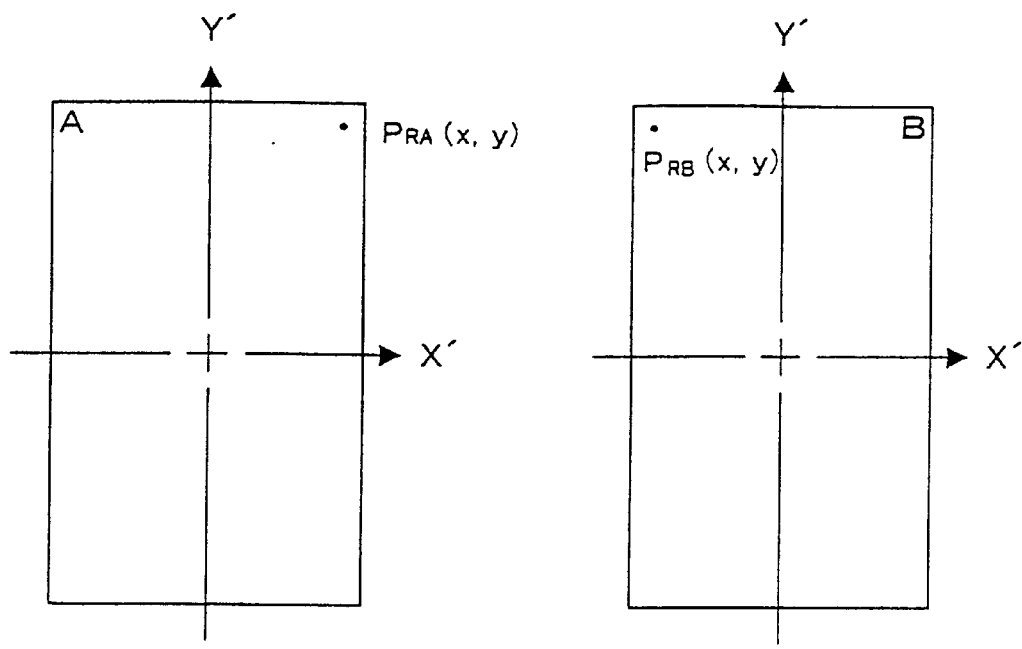
FIGS. 10A and 10B show the method of setting an evaluation point when a pattern contains an overlapping portion.
Figure 10B:
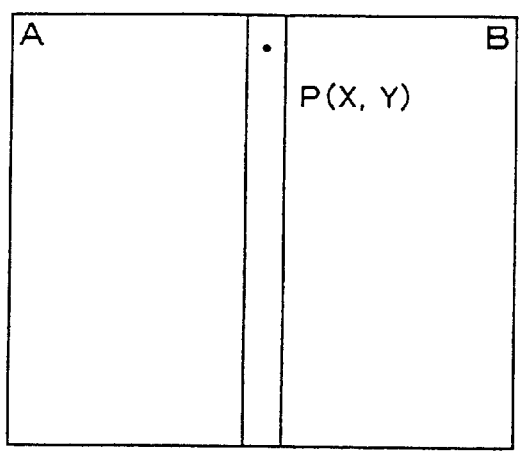

When a screen is generated in producing a liquid crystal substrate, each pattern overlaps another pattern a little at their joint, and is then exposed. FIGS. 10A and 10B show the designation of the evaluation point P on the shot map when a screen is generated, and the positions $P_{RA}$ and $P_{RB}$ on the reticle 3 corresponding to the evaluation point P. As shown in FIG. 10A (in this example, only the patterns A and B are referred to in the descriptions), the joint between the patterns A and B refers to the overlap of the patterns. Therefore, when an evaluation point is designated at the overlap, the points corresponding to the evaluation point appear as points $P_{RA}$ and $P_{RB}$ respectively in the patterns A and B (FIG. 10B). In this operation example, the operator selects, for example, using a selection unit 27, on of the patterns A and B containing the designated evaluation point P, and the coordinates of the point corresponding to the reticle 3 on the selected pattern are obtained because the position of a reticle, which has one pattern as a reference and another pattern, can be amended.

FIG. 11 is a flowchart prepared with the second process of determining the evaluation point taken into account. As shown in FIG. 11, when the process is started, the display device 22 first displays a shot map (step S11), and an operator designates one point on the shot map as an evaluation point using the designation device 23 such as a mouse, etc. (step S12). Then, the data processing unit 24 of the control device 21 computes the coordinates P (x, y) on the shot map of the evaluation point P (step S13), and lists the patterns containing the evaluation point P (step S14). The data processing unit 24 then determines the number of listed patterns of the reticle 3 (step S15). When the number of patterns is 0 (step S15: 0), it indicates that the designated evaluation point is not located in the pattern, an evaluation point is designated again (step S12). In this case, it is indicated on the display device 22 to the operator that the evaluation point is not located in the pattern, or the operator is notified of the information by an alarm, etc. through a unit not shown in the attached drawings. The operator is notified that it is necessary to designate an evaluation point again. If the determined number of patterns is 1 (step S15: 1), it is not necessary to select a pattern. Therefore, control is passed to the process of obtaining the coordinates of a corresponding point on the reticle 3 (step S17). When there are a plurality of patterns (step S15: more than one), the operator selects one pattern from among a plurality of listed patterns (step S16). In the examples shown in FIGS. 10A and 10B, the two patterns A and B containing the evaluation point P are listed, and one of the patterns is selected by the operator.

When a pattern is selected, the data processing unit 24 computes the position of the point $P_P$ ($P_{PA}$ or PpB) corresponding to the evaluation point P on the projection area (on the plate 6), and obtains the position corresponding to the reticle 3 based on the computed position (step S17). The positions $P_{RA}$ and $P_{RB}$ corresponding to the reticle 3 are displayed on the display device 22 (step S18). The method of computing and displaying the position of the point $P_P$ are the same as those described by referring to FIG. 6, and therefore the detailed explanation is omitted here. In this process, when it is determined in step S15 that there are a plurality of patterns, the positions of the corresponding point $P_P$ can be computed for all the plurality of patterns to display all coordinates of the positions, and the difference between the relative positions of two corresponding points can be computed and displayed. In addition, the operator can designate a primary pattern and a secondary pattern in the plurality of patterns to display the coordinates of the corresponding point $P_R$ with the difference clearly indicated. In this case, it is also possible to compute and display the amount of discrepancy of the corresponding point $P_{RB}$ on the secondary pattern relative to the corresponding point $P_{RA}$ on the primary pattern.

In actually generating a liquid crystal substrate, the pattern of the reticle of the first layer is exposed. On the first layer, a plurality of patterns are exposed and formed. In evaluating such a liquid crystal substrate, there are the problem of pattern joint precision (the amount of discrepancy between adjacent patterns) with the first layer, and the problem of the overlap precision (the amount of discrepancy between the pattern of the first layer and the overlapping pattern of the second layer) and the overlapping difference precision (the amount of relative discrepancy between the adjacent patterns on the second layer) with the second layer. The evaluation is performed at the boundary or in the vicinity of the patterns. However, the problem of the joint precision can be solved by obtaining the coordinates of the two corresponding points $P_{PA}$ (x, y) and $P_{PB}$ (x, y) in the above described processing method, and by obtaining the difference between the relative positions.

When the overlap precision and the overlapping difference precision are measured, or when the joint precision is measured in the case where patterns indicate no overlapping portions, the evaluation has to be performed at two points having the boundary of adjacent patterns (joint portion) between the two points. The exposure apparatus according to the present embodiment has the function of easily designating the two points around the boundary of patterns.

Figure 12:
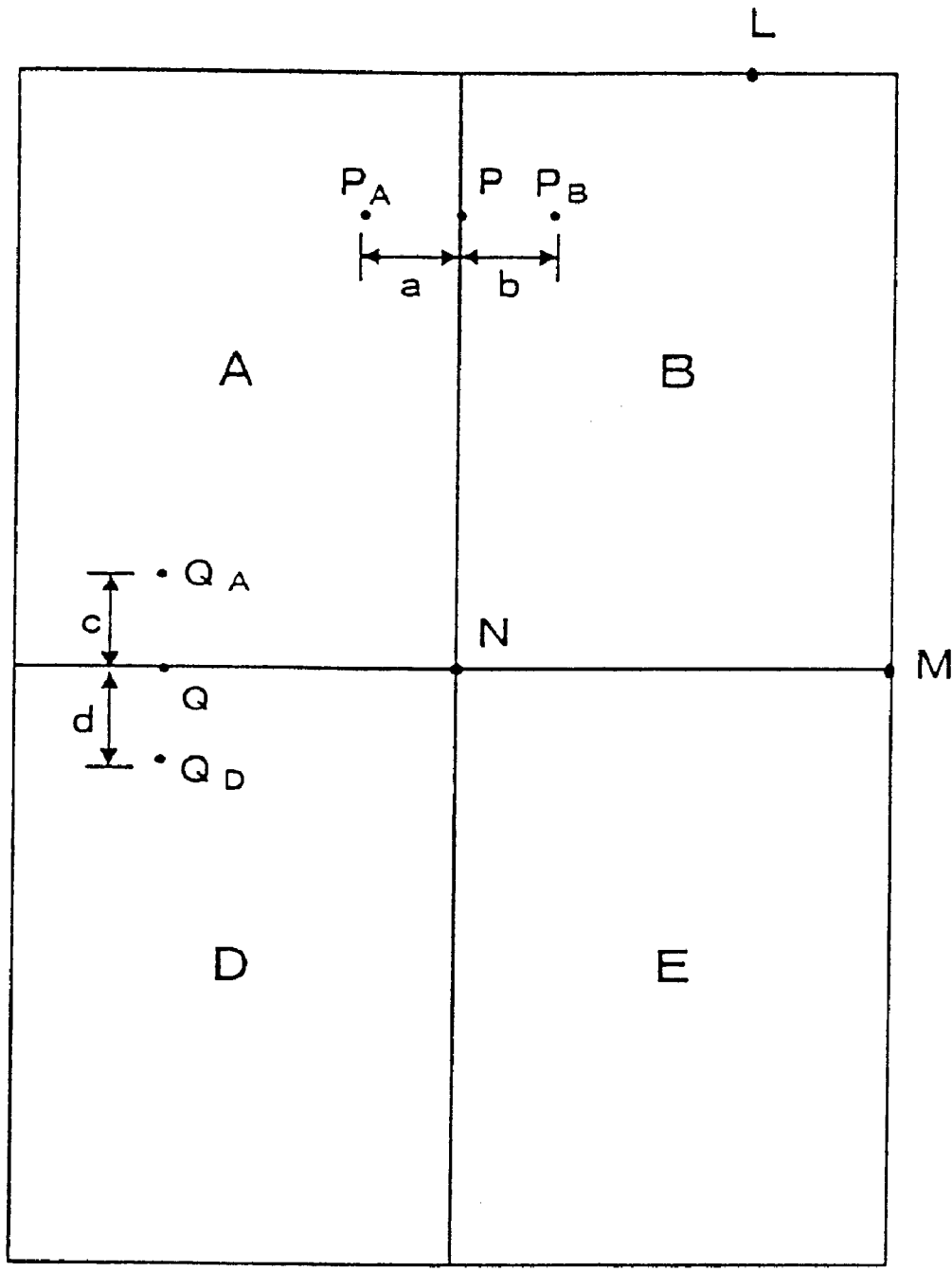
FIG. 12 shows the method of designating two points around the boundary of a pattern present invention.

FIG. 12 shows the function of the exposure apparatus designating two points around the boundary of patterns according to the present embodiment. As shown in FIG. 12, when a point P is designated at the boundary between the patterns A and B, a point $P_A$ the distance a away from the point P toward the pattern A, and a point $P_B$ the distance b away from the point P toward the pattern B are designated, and the positions ($P_{PA}$ (x, y) and $P_{PB}$ (x, y)) of the corresponding points on the plate are obtained. Similarly, when the point Q is designated at the boundary between the patterns A and D, a point $Q_A$ the distance c away from the point Q toward the pattern A, and a point $Q_D$ the distance d away from the point Q toward the pattern D are designated, and the positions ($Q_{PA}$ (x, y) and $Q_{PD}$ (x, y)) of the corresponding points are computed.

In this process, it is rare and difficult that the operator can set the points P and Q exactly on the boundary. According to an embodiment of the present invention, the points on the boundary near the points designated by the operator are determined as the points P and Q. In addition, the distances a, b, c, and d from the boundary can be designated by the operator, but the number of values to be designated by the operator can be reduced by setting a constantly equal to b, or by fixing the distance at a predetermined value. In addition, the boundary is not always linear. That is, as shown in FIGS. 10A and 10B, a shot map can be generated with the exposure performed with overlap. In this case, a virtual boundary can be generated for use as a boundary. The virtual boundary can be freely amended if a parameter is set to appropriately adjust the amount of overlap.

Described below is the process (third process of determining an evaluation point) performed when a point near the boundary is designated by the exposure apparatus 20.

Figure 13:
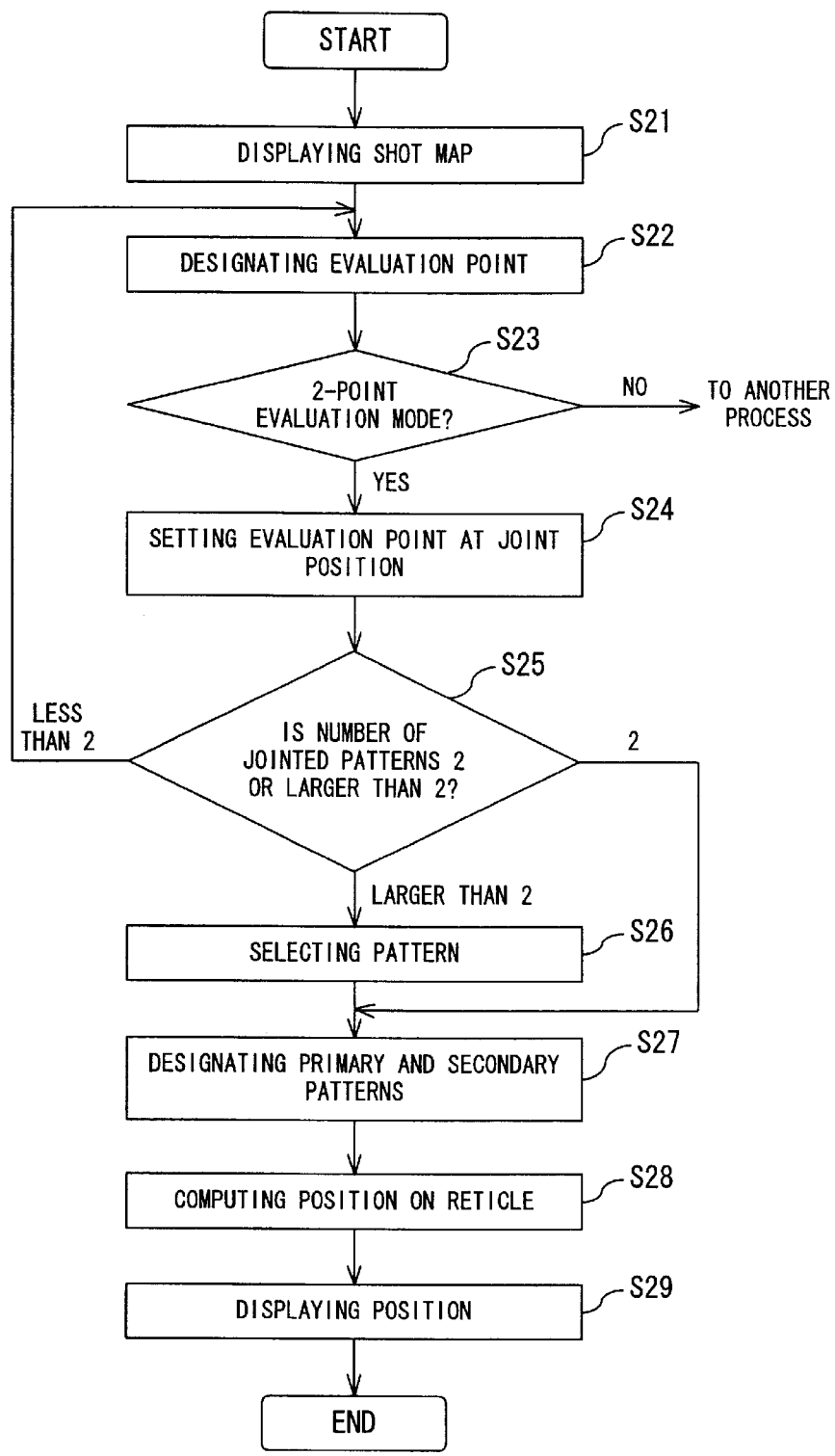
FIG. 13 is a flowchart showing the third example of the evaluation point determining process according to the present invention.

FIG. 13 is a flowchart of the third process of determining an evaluation point. As shown in FIG. 13, when the process is started, the display device 22 first displays a shot map (step S21), and an operator designates one point on the shot map as an evaluation point using the designation device 23 such as a mouse, etc. (step S22). Then, the data processing unit 24 determines (step S23) whether or not the process is set in a mode of evaluating two points near a joint portion. If the mode is not set (step S23: NO), then the process is performed in the currently set mode other than the above described mode. If the above described mode is set (step S23: YES), then control is passed to the next step S24.

In step S24, if the point designated by the operator is not positioned at the joint (on the boundary), then the position of the point is amended to the nearest side of the pattern containing the designated point, and the position is amended onto the boundary. When there is no boundary, that is, when the point is nothing but the end of the pattern, the evaluation point is to be designated again.

Then, the data processing unit 24 determines how many patterns the point on the boundary correspond to (the number of joined patterns) (step S25). When the point on the boundary is positioned on the boundaries of two patterns as the points P and Q shown in FIG. 12, it is determined that the number of joined patterns is 2 (step S25: 2), control is passed to step S27. When a point such as a point L is located on the circumference, or when it is located in a non-pattern area, it is determined that the number of joined patterns is one or 0 (step S25: 1 or 0), control is returned to step S22, and the evaluation point is designated again. In this case, the display device 22 displays to the operator that the number of joined patterns is 1 or 0, or the operator is notified of the information by an alarm, etc. through a unit not shown in the attached drawings. Then, the operator is informed by the display, etc. that it is necessary to designate the evaluation point again. In addition, when the point is positioned at, for example, the point M or N, it is determined that the number of joined patterns is 3 or 4 (step S25: 3 or more), and control is passed to step S26 where the operator selects two patterns.

In step S27, the operator designates the primary pattern and the secondary pattern for the two selected patterns. Then, the data processing unit 24 computes the positions of the points ($P_{RA}$ and $P_{RB}$ or $Q_{RA}$ and $Q_{RB}$) corresponding to the above described two points ($P_A$ and $P_B$ or $Q_A$ and $Q_D$) on the reticle (step S28), computes the position (relative position) of the point on the secondary pattern relative to the primary pattern, and outputs the result to the display device 22 (step S29). At this time, the coordinates of the computed positions of the two points can be displayed, and the selected pattern can be displayed together.

Described above is an embodiment of the present invention. However, the present invention is not limited to the above described embodiment, but can be applied to various applications with the scope of the technical concept of the present invention.

For example, according to each of the above described embodiments, the projective exposure apparatus is operated in the step-and-repeat system for an LCD. However, the scope of the present invention can be furthermore extended. The present invention can be applied not only to the projective exposure apparatus in the step-and-repeat system for an LCD, but also to the projective exposure apparatus in the step-and-repeat system for a semiconductor element, image pickup device (CCD, etc.), base board reticle, thin-film magnetic head, etc. Especially, the projective exposure apparatus in the step-and-repeat system for a semiconductor element has been disclosed by U.S. Pat. No. 4,748,478, and the disclosure is included as a part of the specification of the present invention.

In addition to the projective exposure apparatus in the step-and-repeat system, the present invention can be applied to the projective exposure apparatus in the scanning system. In the projective exposure apparatus in the step-and-repeat system, the XY stage is moved by a predetermined distance, and a pattern is exposed onto an exposure area. On the other hand, in the projective exposure apparatus in the scanning system, a reticle and an XY stage are synchronously moved, and a pattern is exposed onto an exposure area. The projective exposure apparatus in the scanning system includes an inversion/reduction system and an equimultiple erect orthoscopic image system. The projective exposure apparatus in the inversion/reduction scanning system is often used for semiconductor elements while the projective exposure apparatus in the equimultiple erect orthoscopic image scanning system is often used for LCDs. The exposure apparatus in the scanning system for LCDs is disclosed by U.S. Pat. No. 5,579,147, and the exposure apparatus in the scanning system for semiconductor elements is disclosed by U.S. Pat. No. 5,473,410. Each disclosure is included in the specification of the present invention as a part of the disclosure of the present invention.

FIG. 14 mainly shows the projective optical system of the projective exposure apparatus in the inversion/reduction scanning system. As shown in FIG. 14, the reticle 3 is illuminated in the rectangular (in a slit form) illustration area IAR having a longer side in the direction vertical to the scanning direction (Y axis direction) of the reticle 3, and the reticle 3 is scanned at a speed of $V_R$ in one direction along the Y axis during the exposing process. The illustration area IAR (whose center actually matches the optical axis AX) is projected onto the plate 6 through the projective optical system 4, thereby forming an exposure area IA which is a projection area in a slit form, and is conjugate to the illustration area IAR. Since the plate 6 obtains an inverted image against the image on the reticle, the plate 6 is scanned at a speed of $V_P$ in synchronization with a reticle 3 in the opposite direction (in the + direction along the Y axis) of the direction of the $V_R$ speed, thereby possibly exposing the shot area SA on the plate 6. The scanning speed ratio $V_P/V_R$ actually depends on the reduced magnification of the projective optical system. The pattern of the pattern area PA of the reticle 3 is correctly transferred as reduced on the shot area SA on the plate 6. The width along the longer side of the illustration area IAR is designed to be larger than the pattern area PA on the reticle 3, and smaller than the maximum width of the shielding area ST so that the entire pattern area PA can be illustrated by scanning the reticle 3.

Figure 15:
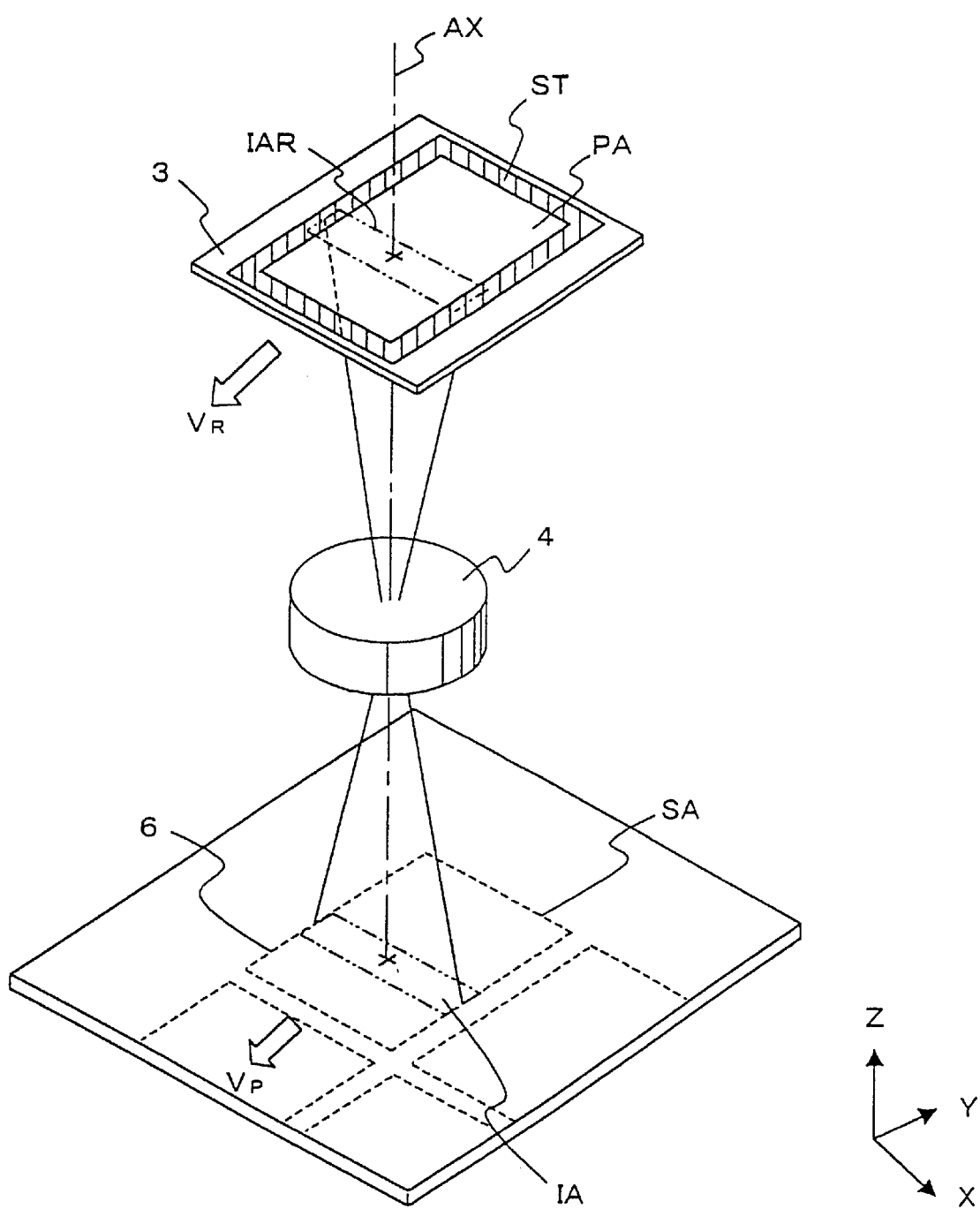
FIG. 15 shows a projective optical system of a projective exposure apparatus in an equimultiple erect orthoscopic image scanning system.

FIG. 15 mainly shows the projective optical system of the projective exposure apparatus in the equimultiple erect orthoscopic image scanning system. As shown in FIG. 15, the reticle 3 is illuminated in the rectangular (in a slit form) illustration area IAR having a longer side in the direction vertical to the scanning direction (Y axis direction) of the reticle 3, and the reticle 3 is scanned at a speed of $V_R$ in one direction along the Y axis during the exposing process. The difference from the above described projective optical system of the projective exposure apparatus in the inversion/reduction scanning system is that the plate 6 is scanned at a speed of $V_R$ in synchronization with a reticle 3 in the same direction (in the −direction along the Y axis) of the direction of the $V_R$ speed because the plate 6 obtains an equimultiple erect orthoscopic image against the image on the reticle 3. Therefore, the scanning speed $V_P$ is actually equal to the scanning speed $V_R$. The pattern of the pattern area PA of the reticle 3 is correctly transferred as equimultiple on the shot area SA on the plate 6.

The present invention can be applied to the above described projective exposure apparatus in the scanning system by storing in the memory of the control device according to the present invention the information about a reticle, a projective optical system, etc. in the system of an exposure apparatus.

The projective exposure apparatus in the scanning system as well as the projective exposure apparatus in the step-and-repeat system can also be applied to an LCD, a semiconductor element, an image pickup device (CCD, etc.), a base board reticle, a thin-film magnetic head, etc.

In addition, for example, a high-temperature and high-pressure mercury exposure apparatus is described in the above mentioned embodiment. However, the scope of the present invention is not limited to this application. That is, it can be applied to an ArF exposure apparatus and an EB exposure apparatus. The EX exposure apparatus is disclosed by U.S. Pat. No. 5,260,151, and the disclosure is included in the specification of the present invention as a part of the disclosure of the specification of the present invention. Furthermore, the present invention can also be applied to a VUV exposure apparatus using a vacuum ultraviolet area light as an illumination light for exposure such as an F2 laser light (having wavelength of 157), an EUV exposure apparatus using a light having a wavelength of 5 through 15 nm as an illumination light for exposure, and an exposure apparatus using a charged particle beam such as an X ray exposure apparatus, an ion beam exposure apparatus, etc. Furthermore, the present invention can accept air as the atmosphere in the chamber, and can be applied to a DUV exposure apparatus using a KrF excimer laser beam, a g line, an i line, etc. as an illumination light for exposure.

Furthermore, the present invention can produce an exposure apparatus according to each of the above described embodiments by incorporating an illuminating optical system and a projective optical system (or an electro-optical system) comprising a plurality of lenses into the body of an exposure apparatus, by connecting wire and pipe with a reticle stage (reticle exchange mechanism), and an XY stage, a control unit, and a designation unit according to the present invention attached to the body of the exposure apparatus, and by totally adjusting (electric adjustment, operation confirmation, etc.) the entire system. In addition, it is desired that an exposure apparatus is produced in a clean room in which the cleanness, etc. is well managed.

Additionally, an LCD device, a semiconductor device, etc. are produced through the steps of designing the function and the performance of a device, generating a reticle based on the designing step, generating a glass substrate, a wafer, etc., an exposure apparatus according to each of the above described embodiments transferring a predetermined pattern to a glass substrate, a wafer, etc., assembling a device (containing a dicing process, a binding process, a packaging process), checking the entire system, etc.

According to the present invention, an operator can designate an optional evaluation point on a graphical shot map display screen, and can correctly and automatically obtain the position of the evaluation point on a reticle. Therefore, an amendment value on the point can be easily obtained, and an LCD substrate, etc. can be precisely generated within a short time. In addition, the operations of designating an evaluation point and reading the coordinates can be performed not manually, but on the display screen, and the evaluation point and the coordinates can be easily changed and corrected. Therefore, the operator can efficiently perform the operations.

Additionally, a plurality of evaluation points can be simultaneously designated, and corresponding patterns can be automatically provided, thereby furthermore improving the operation efficiency.

What is claimed is:

1. An exposure apparatus exposing a pattern on a reticle onto an exposure area of a substrate, comprising:

a controller having a CPU to control an exposure operation of the exposure apparatus, the controller having information including the exposure area of the substrate and the reticle, a display unit that communicates with the controller to display a shot map showing the exposure area of the substrate;

a designation unit that communicates with the controller to designate an evaluation position on the shot map; and an output unit that communicates with the controller to output information to the display unit about a position of the reticle corresponding to the designated evaluation position so that the display unit displays the position of the reticle corresponding to the designated evaluation position.

2. The apparatus according to claim 1, further comprising:

a reticle exchange unit that holds a plurality of reticles;

wherein the controller exposes a part of patterns on the plurality of reticles as overlapping onto the substrate.

3. The apparatus according to claim 2, wherein said output unit outputs plural pieces of information about the position of the reticle when the designated position refers to the overlapping portion.

4. The apparatus according to claim 2, further comprising a selection unit selecting information about a position of a reticle from among the plurality of reticles corresponding to the overlapping portion when the designated position refers to the overlapping portion.

5. The apparatus according to claim 1, wherein said information about the position of the reticle refers to at least one of a position from a center of the reticle and a position from a center of the pattern.

6. The apparatus according to claim 1, wherein a step-and-repeat system or a scanning system is adopted.

7. An exposure apparatus exposing a pattern on a reticle onto a plurality of exposure areas of a substrate, comprising:

a storage unit that stores information including the plurality of exposure areas of the substrate, the reticle, and an error of the exposure in correspondence with the plurality of exposure areas;

a display unit that communicates with the storage unit to display a shot map showing the exposure area of the substrate;

a designation unit that communicates with the storage unit to designate an evaluation position on the shot map; and an output unit that communicates with the storage unit to output the information about the error of the exposure at the designated evaluation position.

8. The apparatus according to claim 7, wherein a step-and-repeat system or a scanning system is adopted.

9. A method of exposing a pattern on a reticle onto an exposure area of a substrate, comprising:

provviding information including the exposure area of the substrate and the reticle using a controller having a CPU;

displaying a shot map showing the exposure area using a display unit;

designating an evaluation position on the shot map using a designation unit, and outputting information to the display unit, using an output unit, about the position of the reticle corresponding to the designated evaluation position so that the display unit displays the position of the reticle corresponding to the designated evaluation position.

10. The method according to claim 9, further comprising exposing a part of the patterns on the plurality of reticles as overlapping onto the substrate.

11. The method according to claim 10, further comprising outputting plural pieces of information about the position of the reticle when the designated position refers to the overlapping portion.

12. The method according to claim 10, further comprising selecting the information about the position of a reticle from among the plurality of reticles corresponding to the overlapping portion when the designated position refers to the overlapping portion.

13. The method according to claim 9, wherein said information about the position of the reticle refers to at least one of a position from a center of the reticle and the position from a center of the pattern.

14. A method of exposing a pattern on a reticle onto an plurality of exposure areas of a substrate, comprising:

providing the plurality of exposure areas of the substrate, the reticle, and an error of the exposure in correspondence with the plurality of exposure areas using a storage unit, displaying a shot map showing the plurality of exposure areas using a display unit;

designating an evaluation position on the shot map using a designation unit; and outputting the information about the error of the exposure at the designated evaluation position according to the stored information using an output unit.

* * * * *